United States Patent
Teoh et al.

[11] Patent Number: 5,713,276
[45] Date of Patent: Feb. 3, 1998

[54] FLEXIBLE SELF-LEVEL SQUEEGEE BLADE

[75] Inventors: Ping Chow Teoh; Ka Tiek Lim, both of Penang; Phoon Foo Ang, Perak, all of Malaysia

[73] Assignee: Motorola, Inc., Schaumburg, Ill.

[21] Appl. No.: 645,403

[22] Filed: May 13, 1996

[30] Foreign Application Priority Data

Sep. 22, 1995 [MY] Malaysia ............... PI9502830

[51] Int. Cl.⁶ ..................... B41L 13/18
[52] U.S. Cl. ............ 101/123; 101/120; 101/169
[58] Field of Search ............... 101/120, 169, 101/119, 154, 155, 157, 123; 118/261

[56] References Cited

U.S. PATENT DOCUMENTS

| | | | |
|---|---|---|---|
| 3,930,445 | 1/1976 | Jaffa | 101/120 |
| 4,373,445 | 2/1983 | Kobler | 101/365 |
| 4,485,738 | 12/1984 | Gertsch et al. | 101/365 |
| 5,119,755 | 6/1992 | Beisswanger | 118/123 |
| 5,536,312 | 7/1996 | Madrzak et al. | 118/118 |

*Primary Examiner*—Edgar S. Burr
*Assistant Examiner*—Dave A. Ghatt
*Attorney, Agent, or Firm*—Andrew S. Fuller

[57] ABSTRACT

A flexible metal squeegee blade (500) includes a plurality of grooved portions (502) etched on a rectangular metal blade plane (504) to provide for greater flexibility at the grooved portions (502) of the blade.

15 Claims, 3 Drawing Sheets

FLEXIBILITY ALONG THE BLADE

FLEXIBLE SELF-LEVEL SQUEEGEE BLADE

CROSS REFERENCE TO RELATED APPLICATIONS

This application is related to U.S. application Ser. No. 08/645,404 by Tan, et al., entitled "A DIFFERENTIAL THICKNESS STENCIL," U.S. application Ser. No. 08/645,402 by Aun, et al., entitled "A STENCIL SHIFTER" U.S. application Ser. No. 08/645,405, by Tan, et al., entitled "A PASTE RETAINER," all related to corresponding applications previously filed in Malaysia, assigned to Motorola, Inc. and filed concurrently herewith.

TECHNICAL FIELD

This invention relates in general to squeegee blades and in particular to squeegee blades for printing paste on a substrate.

BACKGROUND

Screen printing on substrates, such as ceramic thick-film hybrid microcircuits and printed circuit boards (PCBs) for Surface Mounting Technology (SMT) is well-known.

Referring to FIGS. 1 and 2, films or paste of various materials, such as solder, can be deposited by screen or stencil printing. The screen printer is a precision apparatus that provides for mounting or setting-up a screen or stencil 14, positioning the screen relative to a substrate 32 in x, y, and z directions, and a rolling angle, positioning a squeegee 16 with a blade 18 attached relative to the screen, positioning and moving a nestplate 42 that supports the substrate 32, and moving the squeegee 16 with a controlled speed. The stencil 14 is typically constructed of a stamped stainless steel and etched with a through-hole pattern in the regions in which a paste is to be printed through the etched cavities or holes 142 of the stencil 14. For reproducible quality printing, the screen or stencil tension and surface must be uniform and held down by an aluminum frame 146. However, in reality, the top surface of stencils 14 are often not perfectly flat.

The reservoir of paste 12 is deposited on the stencil 14 by a paste dispenser when the nestplate is in its original unraised position. During printing, when the nestplate 42 is raised, the squeegee blade 18 is deflected in the deformed area of the stencil 14 outside of the nestplate 42 and substrate 32. The nestplate 42 is raised to position the supported substrate 32 in direct contact with and below the forced-up center portion of the stencil 14, so that the center portion of the stencil 14 is brought in contact with the substrate 32 in the area under the squeegee 16 stroke and the paste 12 is forced through the cavities 142 of the stencil 14 by the blade 18. Preferably, the nestplate 42 will be raised a distance 22 higher than the stencil 14 to obtain good printing results.

After the squeegee blade sweep during which the paste comes in contact with the substrate, the paste wets the substrate. As the squeegee passes, the nestplate 42 supporting the substrate 32 is lowered to its original position away from the original substantially flat stencil 144, leaving the paste that was in the holes of the stencil deposited on the substrate in the desired pattern.

The reason why the nestplate 42 has to travel a little higher then the stencil 14 is because the bottom surface of the substrate covering portion of the stencil has be mated tightly to the top surface of the substrate or PCB 32 to ensure that the paste 12 being printed to the surface of the PCB is limited to the area of the hole 142 on the stencil. In other words, the printed paste must follow the shape of the hole 142 such that paste will not be allowed into any gaps between the two surfaces of the PCB and the stencil 14 to create the smear paste situation. However, this level difference of the stencil 14 surface requires the squeegee blade to be able to be deflected more over the substrate portion in order for the blade and substrate to be constantly in contact with the stencil surface.

Conventionally, the current squeegee design uses a single piece of rigid metal blade. This conventional uniform long squeegee blade must form a parallel seal with the stencil during the dynamic printing stroke as well as the static original position when the nestplate has not been raised yet, and maintain a constant angle of attack with the stencil so that the force exerted on the paste is constant. As the nestplate surface becomes larger to accommodate printing more substrates simultaneously, the blade length has to be increased also. However, as the blade length increases, maintaining a parallel aligned blade across the length of the nestplate becomes that much more difficult. Usually, set-up time is quite substantial for a person to align the blade such that it will be parallel to the stencil during both static and dynamic conditions.

Moreover, as the substrate size and line definition of the pattern usually called pitch become smaller, with the advance of microelectronics, controlling the quality of the printing process becomes more complex. The quality problems includes paste smearing, uneven thickness of paste deposition, paste escape from the reservoir outside the nestplate area which resulted in paste volume variation, and the mixing of escaped "dry" paste from the reservoir with the "fresh" paste applied by the squeegee blade.

To achieve a cleaner sweep of the squeegee blade over the substrate, the squeegee printing force is increased. As the the vertical force from the squeegee to the stencil or printing force increase, the squeegee blade will be deflected more, therefore increasing the chances that the blade contacts fully to the surface of the stencil. However, the increased squeegee force itself also causes paste smearing.

Furthermore, because the printing surface area of the substrate or the stencil could be uneven, a paste deposition height variation can occur to reduce perfect parallelism. FIGS. 2-4 illustrate this uneven stencil printing problem. Because the current squeegee blade is rigid along its entire length, it cannot maintain close contact between the blade and the uneven stencil surface at the low force pressure needed to prevent paste smearing. Consequently, the paste will go through the gaps 302 between the noncontacted areas of the bumped stencil 148 and create residue paste 202.

Because of differentials in normal reaction forces applied during printing at the four sides outside the substrate area or nestplate, excessive paste can escape there as seen in FIG. 2. This excaped paste inturn causes paste volume variation and the mixing of "dry" and "fresh" paste.

Accordingly, a need exists to compensate for the unevenness of the non-parallel printing components and of the different forces to ease the blade parallel set-up process and to reduce the printing quality problems of the prior-art blade.

SUMMARY OF THE INVENTION

Briefly, according to the invention, there is provided a flexible squeegee blade for a surface mounting technology printer. The outer surface of the blade is indented in at least one portion to form a more flexible squeegee blade having a variable stiffness characteristic in order that the blade does not have to be set-up perfectly parallel with the stencil as it will be compensated by its flexible characteristics.

DETAILED DESCRIPTION OF THE PREFERRED EMBODIMENT

Figure 1:
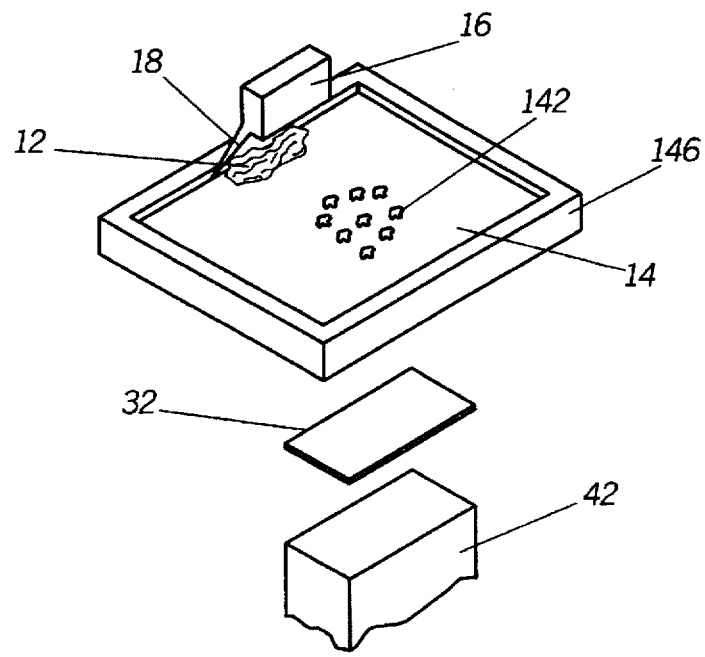
FIG. 1 is a simplified representation of a paste printer.
Figure 2:
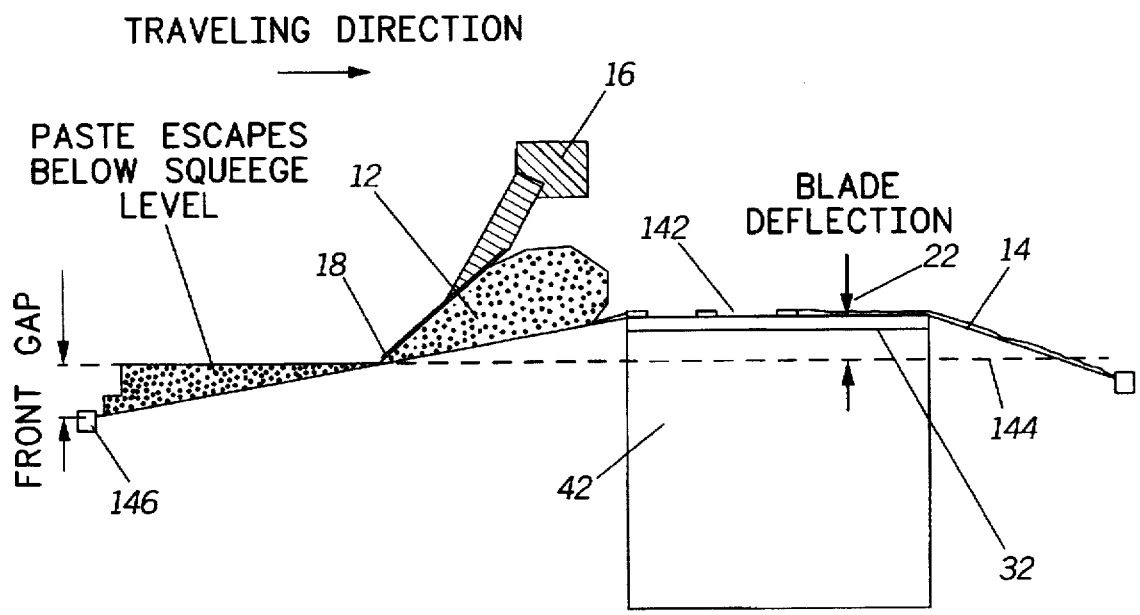
FIG. 2 is a simplified representation of the paste printing process.
Figure 3:
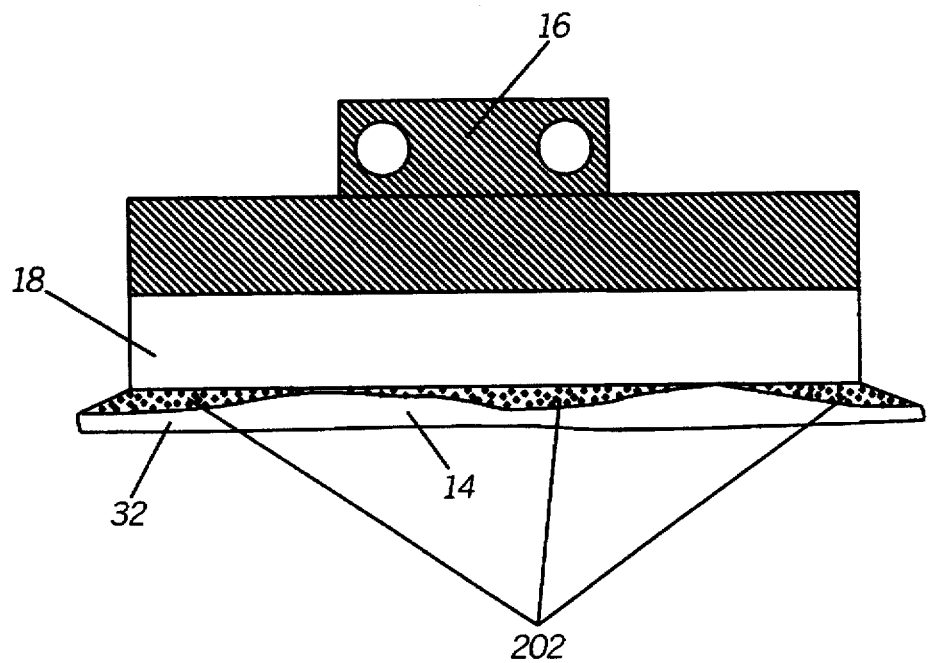
FIG. 3 is a front-view of a prior-art squeegee blade.
Figure 4:
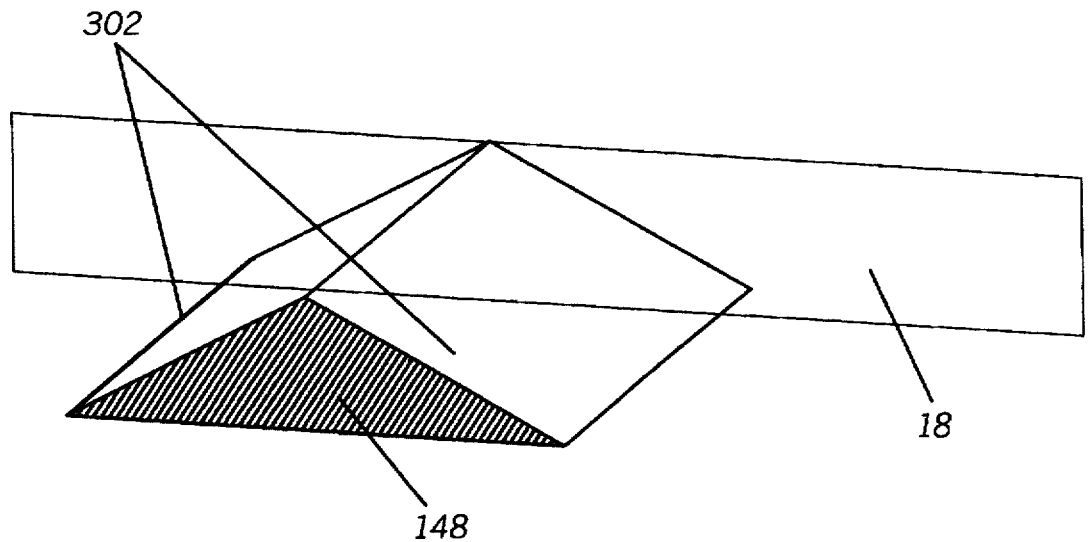
FIG. 4 is an exaggerated non-alignment representation of the prior-art blade of FIG. 2 with a bump of the uneven stencil surface.

Referring to FIGS. 2 and 3, a squeegee blade assembly 16 is shown for printing solder paste on a substrate, such as a blank printed circuit board (PCB) 32 for later surface placement of electronic components on the solder pasted PCB, as part of the Surface Mounting Technology (SMT). A squeegee 16 laterally moves and serves as the movement controller for wiping a blade across the stencil covered substrate underneath. The conventional printer squeegee blade assembly is much like the common T-shaped tool with a mounted blade of rubber for wiping or scraping liquid off a car window surface, except that the blade is made of a solid piece of rigid metal. As the blade's thickness and high stiffness coefficient is uniform along its length, the deflection along the length of the blade will be limited by the uniform high stiffness coefficient. This uniform high stiffness coefficient reduces the chances of having a good mating contact between the blade and the stench surface.

Figure 5:
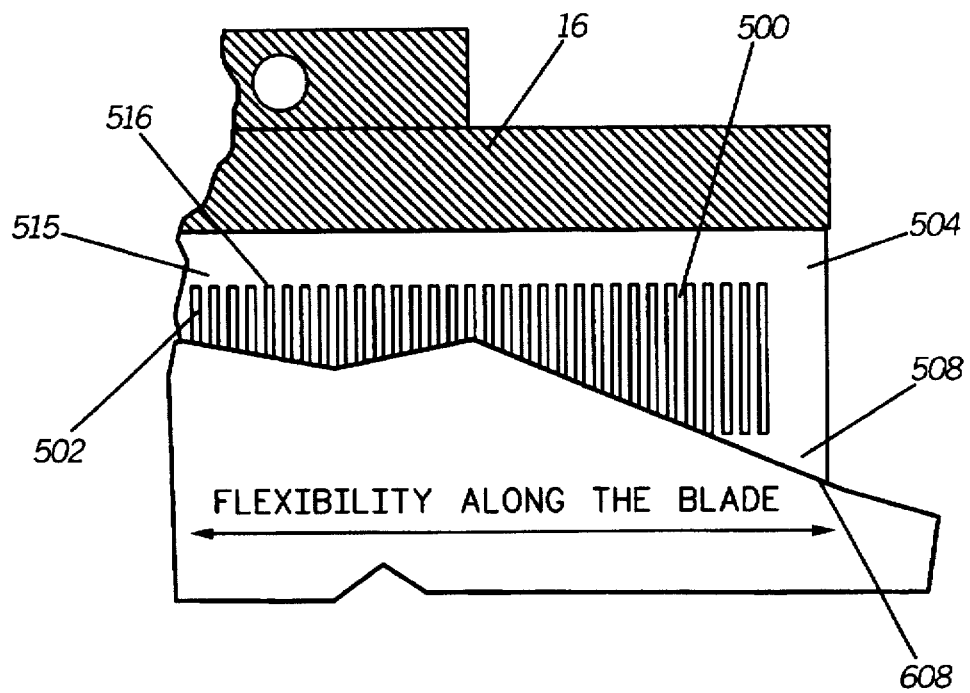
FIG. 5 is a simplified front-view of a squeegee blade, in accordance with the present invention.
Figure 6:
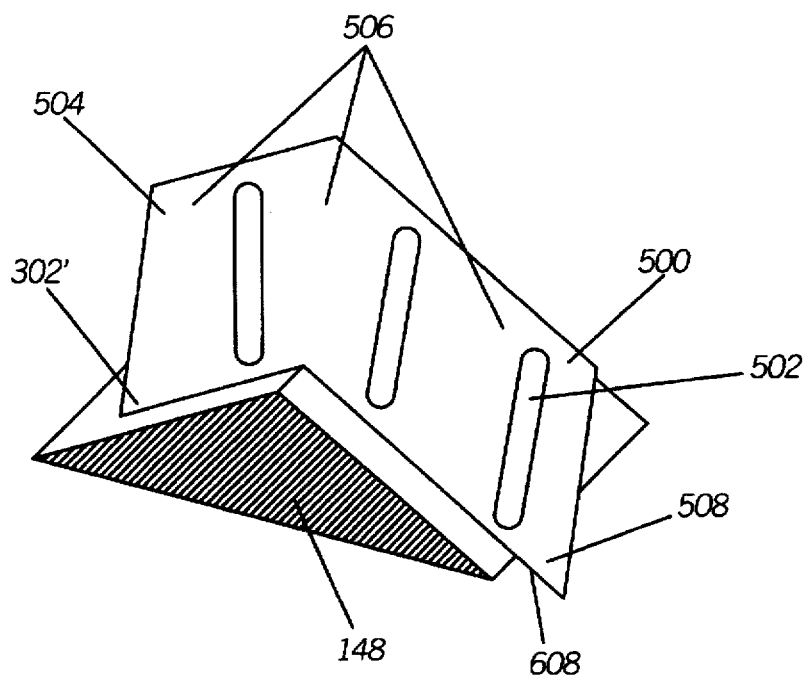
FIG. 6 is an exaggerated alignment representation of the blade of FIG. 5 with a bump of the uneven stencil surface.

Referring to FIGS. 5 and 6, a flexible metal squeegee blade 500 attached to a squeegee 16 for a solder paste printer, in accordance with the teachings of the present invention, shows a plurality of grooved portions 502 etched on the rectangular metal blade plane 504 to provide for greater flexibility at the grooved portions 502 of the blade.

The flexible metal squeegee blade 500 is made-up of a plurality of blade portions 506 having a first stiffness coefficient. At least one blade connector portion, in the form of a groove 502 having a second stiffness coefficient, integrally joins the plurality of blade portions 506 with the at least one blade connector portion 502 for forming a panel 504 having a horizontal end 508. A straight or contact edge 608 integrally joins the panel 504 at the horizontal, paste sweeping, or contact end 508 to provide flexibility at portions of this contact edge that are closest to the grooved portions 502 of the blade. A border 515 on the opposite end 516 is mountably attached to the squeegee 16 of the printer. In this manner, the overall effect is an integral blade made-up of a few different smaller blades aligned together to allow individual variable flexibility. Meanwhile, the smaller or shorter length blades are still joined together without any discontinuous gaps to give the blade sufficient strength.

As one possible connector shape out of many possible shapes and sizes depending on the requirement of the stencil, the blade connector portion 502 is a vertical grooved indentation of the original uniform blade to maintain top-down rigidity. For more flexibility, more vertical grooved indentations can be etched or grinded in between the each of the blade portions, periodically or at various desired locations along the blade to form an accordion-like panel. The more grooves there are, the more flexible the blade is, and calibration and paste control will be that much easier.

Preferably, the connector groove portions 502 are each 10 mm long and 2 mm wide. These grooves having a depth of 0.1 mm are formed on the original blade having a thickness of 0.3 mm. Thus the first stiffness coefficient of the blade portion is necessary higher than the second stiffness coefficient of the connector portion because the connector portion is basically a part of the original blade portion that is etched away and the stiffness of the overall blade panel will vary and flex like an accordion. The smaller stiffness coefficient of the grooves separates the original blade into smaller pieces for the pieces to align or deflect individually to the surface of the bump 148 on the stencil.

For manufacturing simplicity if the straight edge 608 is part of the original blade, than it too will have the same original first stiffness coefficient but will follow the alignment of the stencil surface 148. Hence, the gap 302' between the blade and stencil surfaces will be reduced due to this self-alignment brought about by the grooves 502.

What is claimed is:

1. A squeegee blade comprising:

a plurality of first blade portions having a first stiffness coefficient;

at least one second blade portion having a second stiffness coefficient for integrally joining the plurality of first blade portions with the at least one second blade portion for forming a panel having a continuous free contact end and an opposed squeegee end;

a border integrally joining the panel at the opposed squeegee end; and a continuous scaping edge integrally and perpendicularly joining the panel at the continuous free contact end.

2. The squeegee blade of claim 1 wherein the at least one second blade portion is vertical.

3. The squeegee blade of claim 1 wherein the at least one second blade portion is a vertical grooved indentation of the blade.

4. The squeegee blade of claim 1 wherein the at least one second blade portion comprises a plurality of vertical grooved indentations inserted in between the plurality of first blade portions.

5. The squeegee blade of claim 1 wherein the first stiffness coefficient is higher than the second stiffness coefficient.

6. The squeegee blade of claim 1 wherein the scraping edge has the same first stiffness coefficient.

7. The squeegee blade of claim 1 wherein the at least one second blade portion has a depth of 0.1 mm.

8. The squeegee blade of claim 7 wherein the plurality of first blade portions have a thickness of 0.3 mm.

9. A metal squeegee blade for sweeping solder paste across a substrate, the squeegee blade comprising:

a plurality of first blade portions having a first stiffness coefficient;

at least one second blade portion having a second stiffness coefficient for integrally interconnecting the plurality of first blade portions with the at least one second blade portion for forming an accordioned panel having a continuous sweeping end and an opposed squeegee end;

a border integrally joining the panel at the opposed squeegee end; and a continuous scraping edge integrally and perpendicularly joining the panel at the continuous sweeping end.

10. A flexible metal squeegee blade for a solder paste printer comprising:

a continuous contact edge;

a rectangular plane portion having a continuous sweeping end and an opposed squeegee end, the continuos sweeping end integral and perpendicular to the contact edge; and a plurality of grooved portions etched on the rectangular plane portion in between the continuos sweeping end and the opposed squeegee end to provide flexibility at portions of the continuous contact edge closest to the periphery of the grooved portions of the blade while maintaining durability at the continuous edge.

11. The squeegee blade of claim 10 wherein the plurality of grooved portions are vertical.

12. The squeegee blade of claim 10 wherein the plurality of grooved portions are vertical grooved indentations of the blade.

13. The squeegee blade of claim 10 wherein the plurality of grooved portions comprise a plurality of periodic vertical grooved indentations.

14. The squeegee blade of claim 10 wherein each of the plurality of grooved portions has a depth of 0.1 mm.

15. The squeegee blade of claim 10 wherein the rectangular plane portion has a thickness of 0.3 mm.

* * * * *

UNITED STATES PATENT AND TRADEMARK OFFICE
CERTIFICATE OF CORRECTION

PATENT NO. : 5,713,276
DATED : February 3, 1998
INVENTOR(S) : Teoh, et al.

It is certified that error appears in the above-identified patent and that said Letters Patent is hereby corrected as shown below:

Column 5, lines 2 and 6, delete "continuos" and insert therefor -- continuous--.

Signed and Sealed this

Fourteenth Day of July, 1998

*Attest:*

BRUCE LEHMAN

*Attesting Officer*     *Commissioner of Patents and Trademarks*